United States Patent
Fukuda

(10) Patent No.: US 12,107,180 B2
(45) Date of Patent: Oct. 1, 2024

(54) CELL ASSEMBLY, METHOD FOR PRODUCING CELL ASSEMBLY, SOLAR CELL, AND METHOD FOR PRODUCING SOLAR CELL

(71) Applicant: KANEKA CORPORATION, Osaka (JP)

(72) Inventor: Masanori Fukuda, Toyooka (JP)

(73) Assignee: KANEKA CORPORATION, Osaka (JP)

( * ) Notice: Subject to any disclaimer, the term of this patent is extended or adjusted under 35 U.S.C. 154(b) by 0 days.

(21) Appl. No.: 17/907,231

(22) PCT Filed: Mar. 29, 2021

(86) PCT No.: PCT/JP2021/013333
§ 371 (c)(1),
(2) Date: Sep. 23, 2022

(87) PCT Pub. No.: WO2021/200837
PCT Pub. Date: Oct. 7, 2021

(65) Prior Publication Data
US 2023/0109458 A1    Apr. 6, 2023

(30) Foreign Application Priority Data
Mar. 30, 2020    (JP) .................................. 2020-060126

(51) Int. Cl.
*H01L 31/05*    (2014.01)
*H01L 31/0224*    (2006.01)
*H01L 31/18*    (2006.01)

(52) U.S. Cl.
CPC .. *H01L 31/0508* (2013.01); *H01L 31/022425* (2013.01); *H01L 31/1804* (2013.01)

(58) Field of Classification Search
None
See application file for complete search history.

(56) References Cited

U.S. PATENT DOCUMENTS

| 5,527,717 A | * | 6/1996 | Inoue | H01L 31/022425 438/66 |
| 2013/0139871 A1 | * | 6/2013 | Hirata | H01L 31/048 136/251 |

(Continued)

FOREIGN PATENT DOCUMENTS

| CN | 110277463 A | * | 9/2019 |
| JP | 2014-199875 A |  | 10/2014 |

(Continued)

OTHER PUBLICATIONS

Machine translation of CN110277463A (Year: 2019).*

(Continued)

*Primary Examiner* — Ryan S Cannon
(74) *Attorney, Agent, or Firm* — Studebaker & Brackett PC

(57) ABSTRACT

Provided is a solar cell assembly that includes a plurality of small segments, each of the plurality of small segments being defined by a defining line, which is a straight line substantially parallel to a linear one side of the cell assembly, the solar cell assembly including: a photoelectric conversion part; a transparent conductive layer disposed on an area of a main surface of the photoelectric conversion part corresponding to each of the plurality of small segments, the transparent conductive layer having a first area and a second area; a collector electrode disposed on the first area of the transparent conductive layer and including a plating layer; and a transparent insulating layer disposed on the second area of the transparent conductive layer, in which the photoelectric conversion part is exposed in a defining area, which is an area formed along the defining line and including the defining line.

4 Claims, 10 Drawing Sheets

(56) References Cited

U.S. PATENT DOCUMENTS

| | | | |
|---|---|---|---|
| 2014/0190563 A1* | 7/2014 | Tokuoka | H01L 31/022425 |
| | | | 438/98 |
| 2015/0090317 A1* | 4/2015 | Tokuoka | H01L 31/0682 |
| | | | 438/98 |
| 2015/0364616 A1* | 12/2015 | Tohoda | H01L 31/0747 |
| | | | 136/259 |
| 2018/0145196 A1 | 5/2018 | Ha et al. | |
| 2020/0203545 A1 | 6/2020 | Takahashi et al. | |

FOREIGN PATENT DOCUMENTS

| | | |
|---|---|---|
| JP | 2015-198142 A | 11/2015 |
| JP | 2017-517145 A | 6/2017 |
| JP | 2018-085509 A | 5/2018 |
| WO | 2019/003818 A1 | 1/2019 |
| WO | 2019/087590 A1 | 5/2019 |
| WO | 2019/130859 A1 | 7/2019 |

OTHER PUBLICATIONS

International Search Report issued in PCT/JP2021/013333; mailed Jun. 8, 2021.

International Preliminary Report On Patentability and Written Opinion issued in PCT/JP2021/013333; mailed Oct. 13, 2022.

* cited by examiner

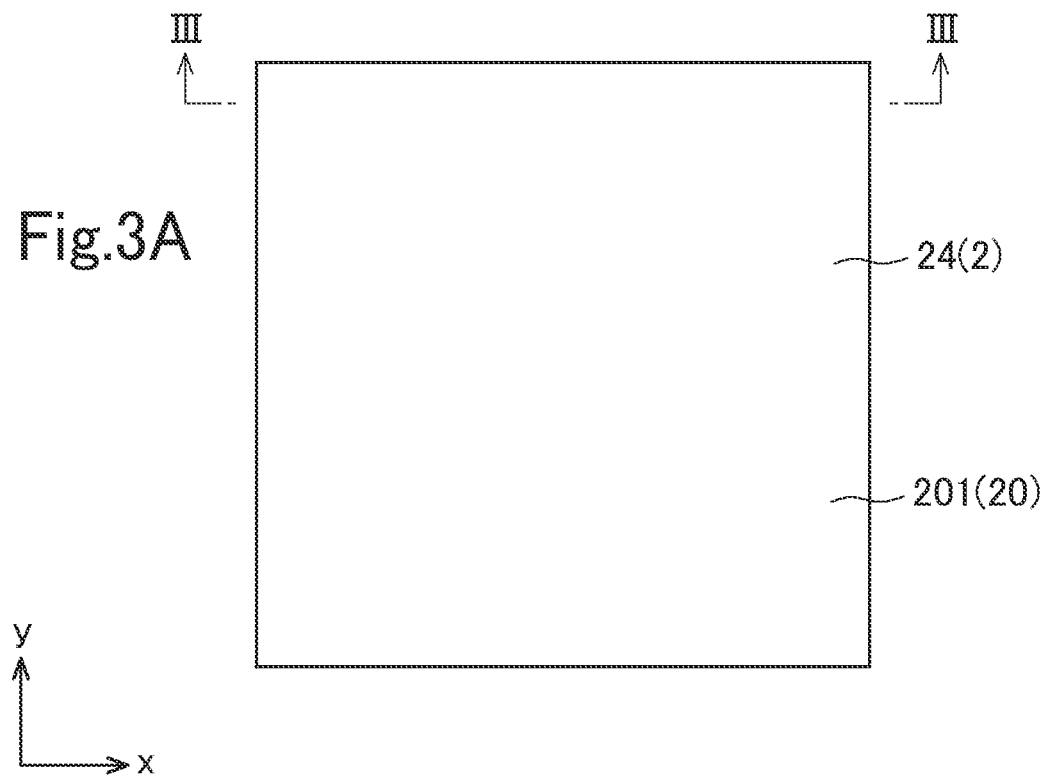
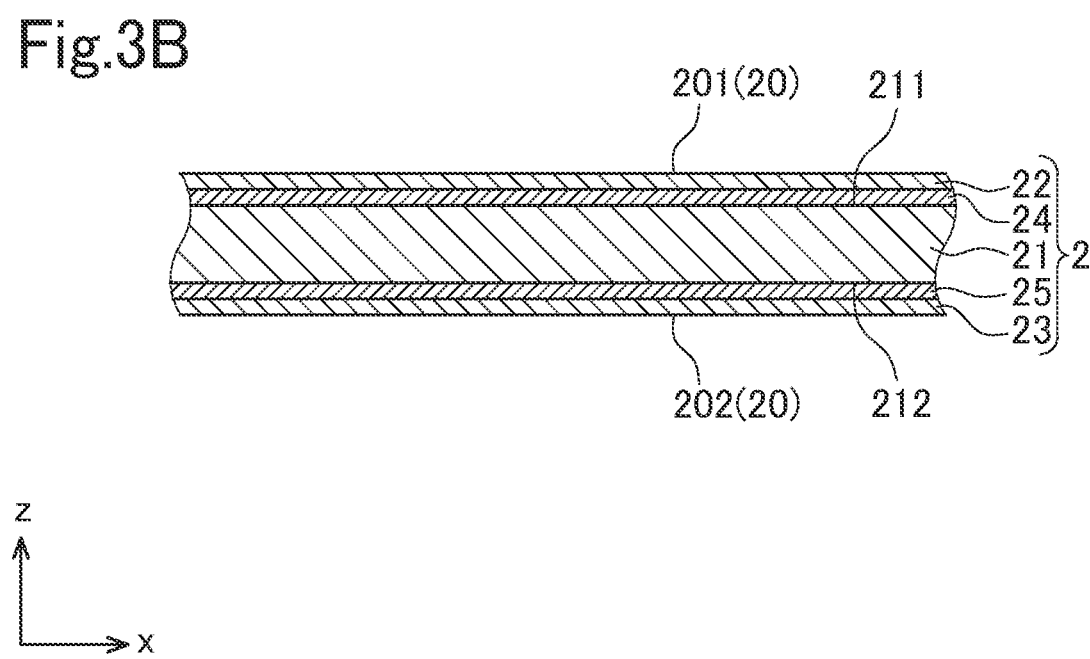

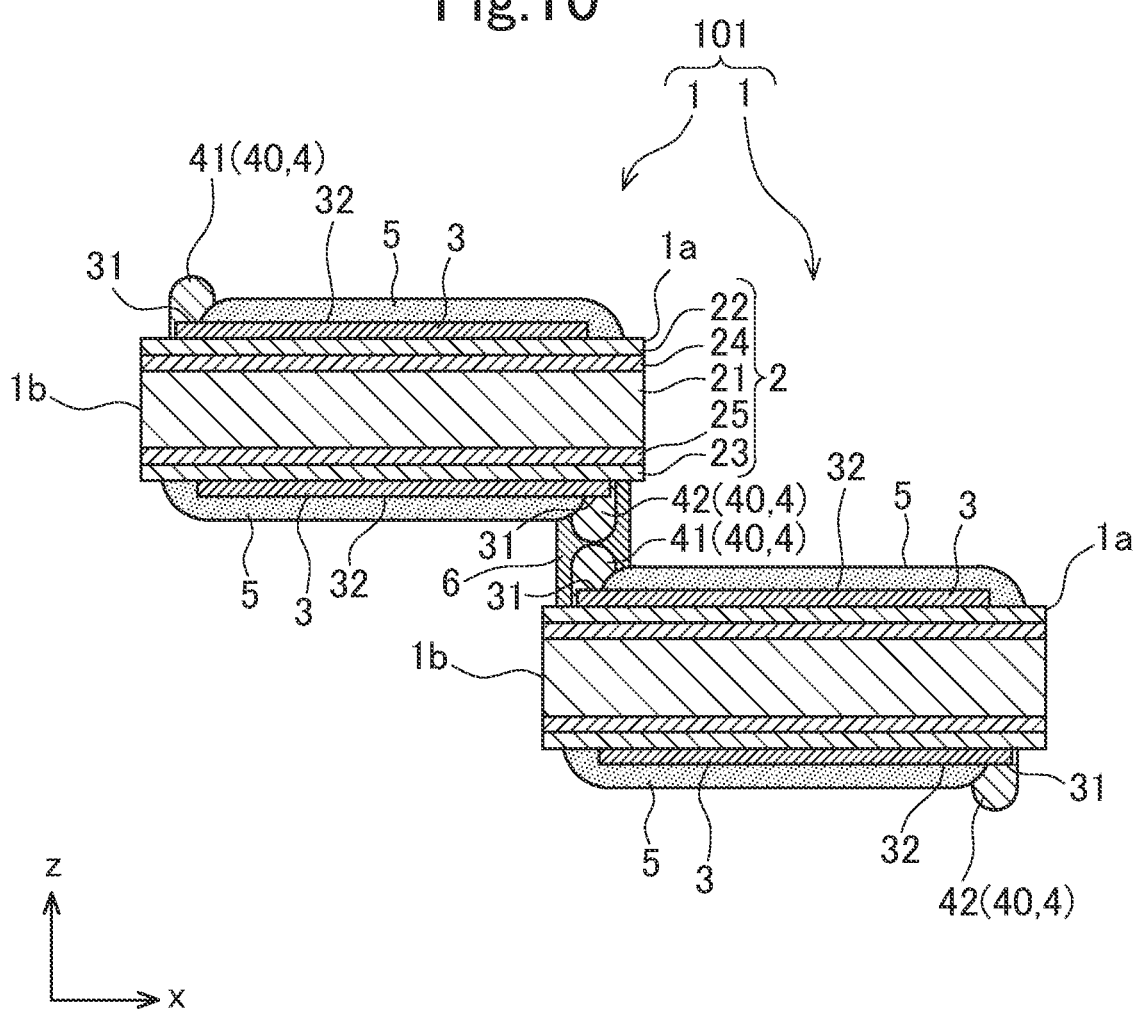

CELL ASSEMBLY, METHOD FOR PRODUCING CELL ASSEMBLY, SOLAR CELL, AND METHOD FOR PRODUCING SOLAR CELL

CROSS-REFERENCE TO RELATED APPLICATION

This application claims priority to Japanese Patent Application No. 2020-060126, the disclosure of which is incorporated herein by reference in its entirety

FIELD

The present invention relates to a cell assembly, which is a material of solar cells to be interconnected with each other by shingling to form a solar cell module, a method for producing the cell assembly, a solar cell formed from the cell assembly, and a method of producing the solar cell.

BACKGROUND

Conventionally, solar cell modules with various different structures have been proposed. Examples of such a solar cell module include a solar module in which a plurality of solar cells having a strip shape are aligned in such a manner that the adjacent solar cells have their adjacent long sides overlapping each other, for example so as to shingle roof boards, and these solar cells in this state have their overlapping end portions connected to each other (Patent Literature 1). In this solar module, the solar cells are arranged to overlap each other to eliminate a gap between each adjacent solar cells. This configuration increases the charging rate of the solar cells in the solar module to enable an increased module efficiency.

Also known is the use of a plating method for forming a metal electrode of a solar cell module (Patent Literature 2). This solar cell module includes: a photoelectric conversion part including a silicon substrate; a first transparent conductive layer and a transparent resin layer sequentially laminated on a light-receiving surface side of the photoelectric conversion part; and a second transparent conductive layer and a transparent resin layer sequentially laminated on a back surface side of the photoelectric conversion part. In this solar cell module, each of the transparent resin layers has an opening, and a surface of the first transparent conductive layer and a surface of the second transparent conductive layer are partially exposed through the opening of the transparent resin layer. Further, the solar cell module includes a plated metal electrode laminated on a portion of each of the surface of the first transparent conductive layer and the surface of the second transparent conductive layer exposed through the opening of the transparent resin layer. In this solar cell module, the transparent resin layer functions as a mask when forming the plated metal electrode, and functions as a protective layer of the completed solar cell module.

When a plated metal electrode located on the light receiving surface side is formed at the time of producing the above solar cell module, the first transparent conductive layer and the transparent resin layer having the opening are first laminated sequentially on the photoelectric conversion part. The opening of the transparent resin layer is formed to have such a shape as to correspond to the shape of the plated metal electrode (that is, the pattern of the plated metal electrode). Further, the plated metal electrode is deposited by electrolytic plating on the portion of the first transparent conductive layer exposed through the opening of the transparent resin layer. The same steps are taken when the plated metal electrode located on the back side is formed.

CITATION LIST

Patent Literature

Patent Literature 1: JP 2017-517145 T
Patent Literature 2: WO 2019/003818 A

SUMMARY

Technical Problem

It is conceivable that the aforementioned solar cells including the plated metal electrodes apply to the solar module having the solar cells arranged to overlap each other as aforementioned, that is, the solar module formed by shingling connection. In such a case, the aforementioned cell assembly including the plated metal electrodes needs to be cut off by laser cutting to obtain the plurality of solar cells having a strip shape. However, it is difficult to obtain divided solar cells since the transparent resin layer of the cell assembly cannot be completely cut off with a laser beam, which is absorbed by this transparent resin layer.

It is an object of the present invention to provide: a cell assembly, which is a material of solar cells to be interconnected with each other by shingling to form a solar cell module, the cell assembly including a metal electrode formed by a plating method and capable of being easily cut off; a method for producing the cell assembly; a solar cell formed from the cell assembly; and a method for producing the solar cell.

Solution to Problem

A solar cell assembly of the present invention includes a plurality of small segments respectively serving as a plurality of solar cells when divided, the solar cell assembly having one linear side in plan view, each of the plurality of small segments being defined by a defining line, which is a straight line substantially parallel to the linear one side of the cell assembly, the solar cell assembly including: a photoelectric conversion part having a main surface; a transparent conductive layer disposed on an area of the main surface of the photoelectric conversion part corresponding to each of the plurality of small segments, the transparent conductive layer having a first area and a second area located at a different position from the first area; a collector electrode disposed on the first area of the transparent conductive layer and including a plating layer; and a transparent insulating layer disposed on the second area of the transparent conductive layer, in which the photoelectric conversion part is exposed in a defining area, which is an area formed along the defining line and including the defining line.

A method for producing a solar cell assembly of the present invention is a method for producing a solar cell assembly including a plurality of small segments respectively serving as a plurality of solar cells when divided, the solar cell assembly having one linear side in plan view, each of the plurality of small segments being defined by a defining line, which is a straight line substantially parallel to the linear one side of the cell assembly, the method including: a step of preparing a photoelectric conversion part having a main surface; a step of forming a transparent conductive layer on an area of the main surface of the photoelectric conversion part corresponding to each of the plurality of small segments; a step of forming, on the transparent conductive layer, a transparent insulating layer having an opening through which a part of the transparent conductive layer is exposed; and a step of forming a collector electrode by a plating method on the transparent conductive layer exposed through the opening, in which the step of forming the transparent conductive layer, the step of forming the transparent insulating layer, and the step of forming the collector electrode are carried out to have the photoelectric conversion part exposed in a defining area formed along the defining line and including the defining line.

A solar cell of the present invention is capable of forming a solar cell string when a plurality of the solar cells are interconnected with each other by shingling, the solar cell having one linear side and a linear opposite side substantially parallel to the one side in plan view, the solar cell including: a photoelectric conversion part having a main surface; a transparent conductive layer disposed on the main surface of the photoelectric conversion part, the transparent conductive layer having a first area and a second area located at a different position from the first area a collector electrode disposed on the first area of the transparent conductive layer and including a plating layer, and a transparent insulating layer disposed on the second area of the transparent conductive layer, in which the photoelectric conversion part is exposed on the one side and the opposite side.

A method for producing a solar cell of the present invention is a method for producing a solar cell using the solar cell assembly, and includes: a step of cutting the cell assembly by irradiating the defining line with a laser beam.

BRIEF DESCRIPTION OF DRAWINGS

FIG. 3A is a plan view of a photoelectric conversion part of the cell assembly.

FIG. 3B is an enlarged cross-sectional view taken along line III-Ill in FIG. 3A.

FIG. 10 is a schematic cross-sectional view of a solar cell string using the solar cells.

DESCRIPTION OF EMBODIMENTS

Figure 1A:
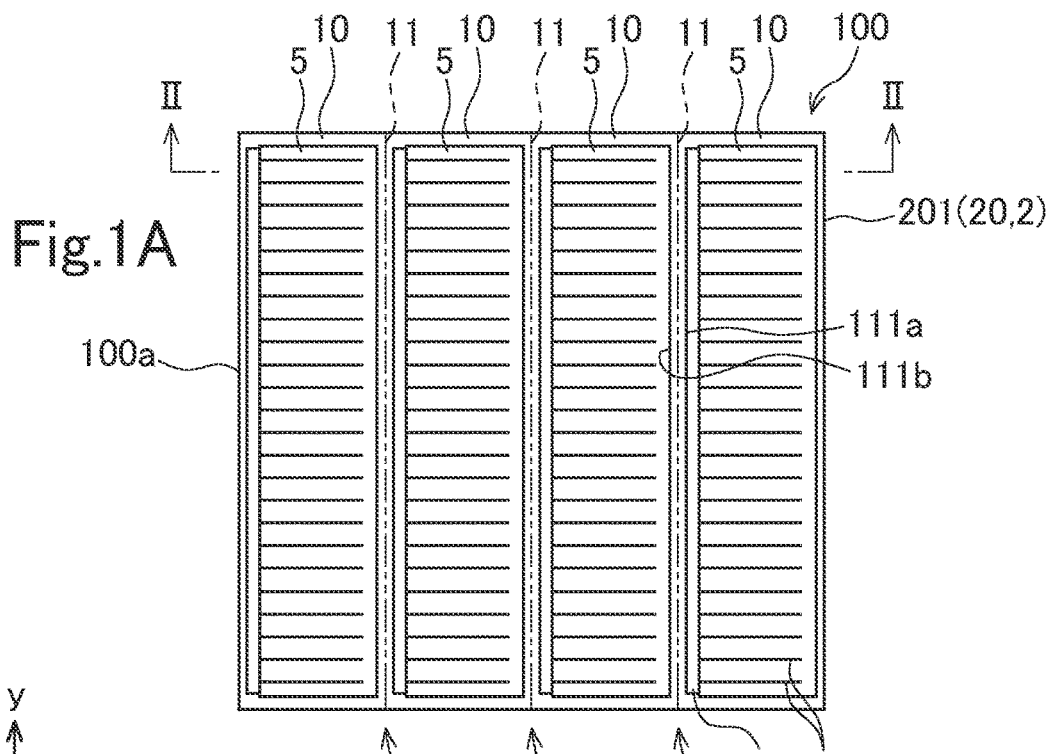
FIG. 1A is a plan view of a solar cell assembly according to this embodiment.

One embodiment of the present invention will be hereinafter described with reference to the drawings. The term "solar cell" herein refers to an individual plate-shaped portion forming a "solar cell string". The drawings schematically show the configuration of this embodiment, and thus differ from design drawings. Thus, some of the dimensions in the drawings are not necessarily accurate.

As shown in FIG. 1A, and Fig. B, a cell assembly 100 of solar cells of this embodiment (hereinafter referred to simply as "cell assembly 100") is an assembly of solar cells including a plurality of small segments 10 respectively serving as a plurality of solar cells 1 when divided. The cell assembly 100 has a linear side (one side 100a) in plan view. Each of the plurality of small segments 10 is defined by a defining line 11, which is a straight line substantially parallel to the one side 100a of the cell assembly 100.

Figure 2:
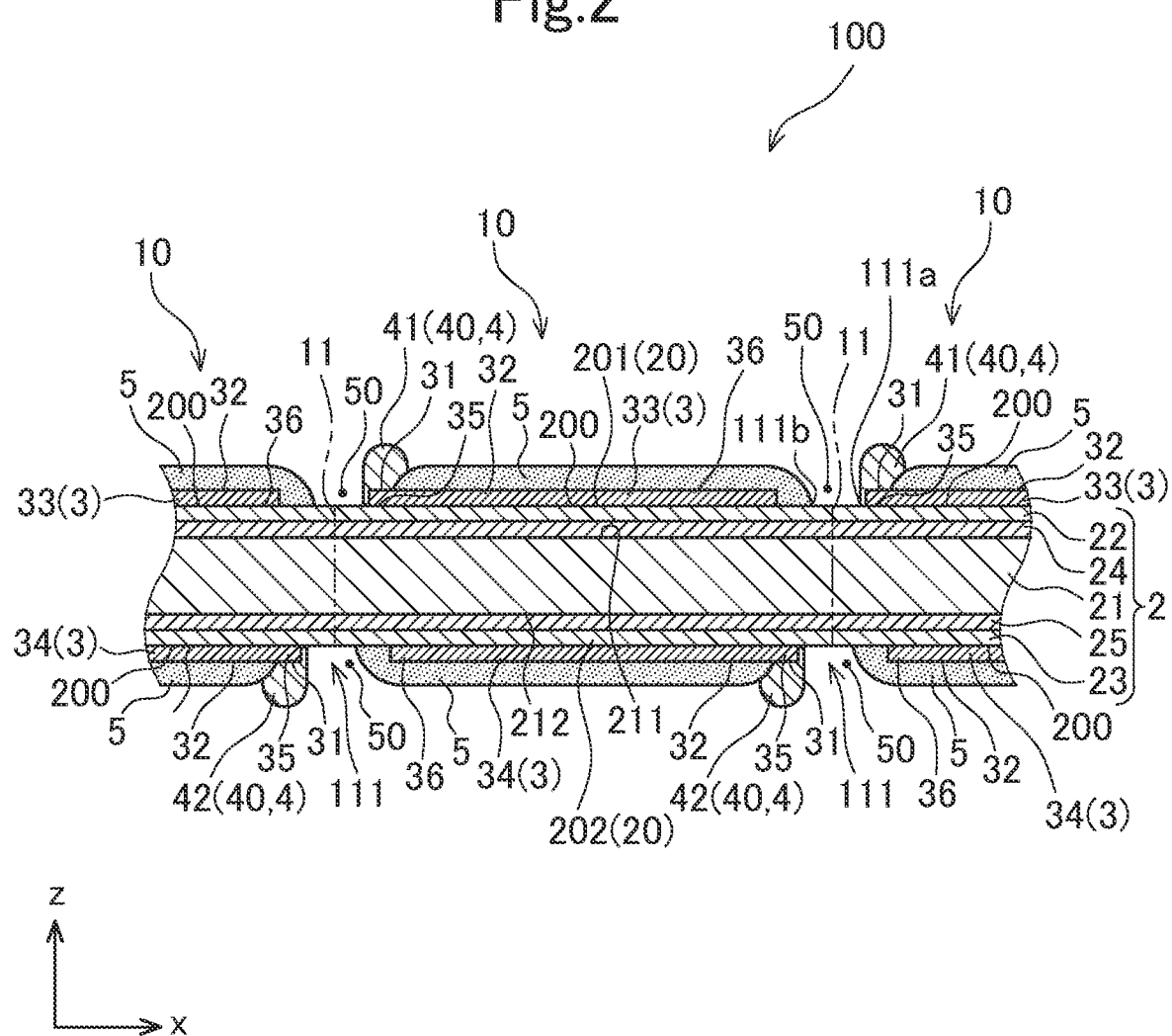
FIG. 2 is an enlarged cross-sectional view taken along line II-II in FIG. 1A.

As shown in FIG. 2, the cell assembly 100 includes: a photoelectric conversion part 2 having a main surface 20; a transparent conductive layer 3 disposed on an area 200 of the main surface 20 of the photoelectric conversion part 2 that corresponds to each of the plurality of small segments 10; a collector electrode 4 disposed on a first area 31 of the transparent conductive layer 3 and including a plating layer 40; and a transparent insulating layer 5 disposed on a second area 32 located at a different position from the first area 31 of the transparent conductive layer 3. In the cell assembly 100 of this embodiment, the layers are laminated in a z-axis direction in FIG. 2. The photoelectric conversion part 2 is exposed in a defining area 111, which is an area formed along the defining line 11 of the cell assembly 100 and including the defining line 11. The main surface 20 is a main surface forming a plate-shaped surface of the photoelectric conversion part 2. The photoelectric conversion part 2 has a side surface (end surface) as an edge.

The cell assembly 100 of this embodiment has a plurality of defining lines 11 and has a plurality of defining areas 111. Specifically, the cell assembly 100 has three defining lines 11 and has three defining areas 111 (see FIG. 1A and FIG. 1B). Further, in the cell assembly 100, the defining lines 11 extend along a y-axis direction and disposed at equal intervals in an x-axis direction.

The defining areas 11*l* of this embodiment extend along the y-axis direction. The plurality of defining areas 111 share the same width (for example, dimension in the x-axis direction). Each of the defining areas III extends on both sides in the x-axis direction of the corresponding one of the defining lines 11. In each of the defining areas 111, for example, a distance between the defining line 11 and an end edge 111a located on one side (i.e., on a right side in FIG. 1A and FIG. 2) in the x-axis direction of the defining area 111 is the same as a distance between the defining line 11 and an end edge 111b located on the other side (i.e., on a left side in FIG. 1A and FIG. 2) in the x-axis direction of the defining area 111. That is, the defining line 11 extends at the center in a width direction (for example, the x-axis direction) of each of the defining areas 111.

The photoelectric conversion part 2 is, for example, a plate-shaped member. The photoelectric conversion part 2 has a pn junction or a pin junction. The photoelectric conversion part 2 of this embodiment includes a conductive type crystal silicon substrate 21 (hereinafter referred to also as "silicon substrate 21") (see FIG. 2). The photoelectric conversion part 2 has a pn junction formed between conductive type silicon-based thin films 22, 23. Further, the photoelectric conversion part 2 of this embodiment also includes intrinsic silicon-based thin films 24, 25 respectively disposed between the silicon substrate 21 and the conductive type silicon-based thin films 22, 23.

The silicon substrate 21 is, for example, either an n-type crystal silicon substrate or a p-type crystal silicon substrate. The silicon substrate 21 of this embodiment is, for example, an n-type single crystal silicon substrate.

A first main surface 211 of the silicon substrate 21 (the upper surface of the silicon substrate 21 in FIG. 2) has a first conductive type silicon-based thin film 22 disposed thereon. A second main surface 212 of the silicon substrate 21 (the lower surface of the silicon substrate 21 in FIG. 2) has a second conductive type silicon-based thin film 23 disposed thereon.

One of the first conductive type silicon-based thin film 22 and the second conductive type silicon-based thin film 23 is a p-type while the other one thereof is an n-type. The first conductive type silicon-based thin film 22 of this embodiment is a p-type. The second conductive type silicon-based thin film 23 of this embodiment is an n-type. Each of the first conductive type silicon-based thin film 22 and the second conductive type silicon-based thin film 23 has a film thickness of 2 nm or more and 20 nm or less.

The transparent conductive layer 3 includes a first transparent conductive layer 33 disposed on a side of a first main surface 201 of the photoelectric conversion part 2, and a second transparent conductive layer 34 disposed on a side of a second main surface 202 of the photoelectric conversion part 2. The material of the transparent conductive layer 3 is, for example, a conductive metal oxide such as ITO (indium tin oxide). The transparent conductive layer 3 has a film thickness of, for example, 20 nm or more and 120 nm or less.

The collector electrode 4 is a patterned metal electrode. The collector electrode 4 of this embodiment is formed of a plating layer 40. The collector electrode 4 of this embodiment includes a first collector electrode 41 disposed on the first main surface 201 of the photoelectric conversion part 2 (the upper surface of the photoelectric conversion part 2 in FIG. 2), and a second collector electrode 42 disposed on the second main surface 202 (the lower surface of the photoelectric conversion part 2 in FIG. 2).

Figure 1B:
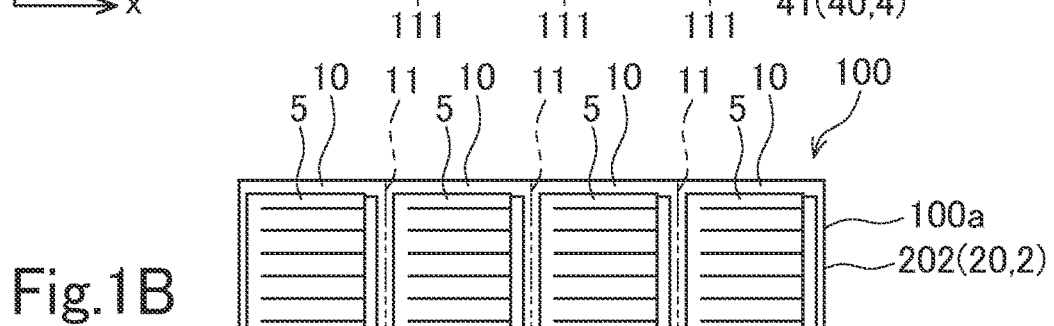
FIG. 1B is a bottom view of the solar cell assembly according to this embodiment.

For example, the collector electrode 4 includes a plurality of finger electrodes 43 extending parallel to each other, and a bus bar electrode 44 extending to intersect (specifically, extending orthogonal to) the finger electrodes 43 (see FIG. 1A and FIG. 1B). In the collector electrode 4 of this embodiment, the finger electrodes 43 and the bus bar electrode 44 form a pattern electrode on a grid. The collector electrode 4 has a thickness of, for example, 10 μm or more and 30 μm or less.

The shape of the second collector electrode 42 is, for example, the same as the shape of the first collector electrode 41. The shape of the second collector electrode 42 can be different from the shape of the first collector electrode 41.

The plating layer 40 is located adjacent to each of the defining areas 111 in which the photoelectric conversion part 2 is exposed. Specifically, the plating layer 40 is aligned in the x-axis direction with the defining area 111 in which the photoelectric conversion part 2 is exposed.

The transparent insulating layer 5 functions as a mask when forming the plating layer 40. The transparent insulating layer 5 also functions as a protective layer of the surface of the completed cell assembly 100 or the completed solar cell 1.

The transparent insulating layer 5 is provided with an opening 50 including an area where the collector electrode 4 is formed (see FIG. 2). That is, the transparent insulating layer 5 is provided with the opening 50 through which the first area 31 of the transparent conductive layer 3 is exposed. Further, out of both end portions of the transparent conductive layer 3 in a direction in which the finger electrodes 43 extend (i.e., the x-axis direction in FIG. 2), one end portion 36 is covered with the transparent insulating layer 5 while the other end portion 35 is exposed.

The material of the transparent insulating layer 5 of this embodiment is, for example, a resin having light transmissivity. It is preferable that this material have thermosetting properties or photocuring properties. The thickness of the transparent insulating layer 5 is, for example, preferably 5 μm or more and 30 μm or less, more preferably 8 μm or more and 20 μm or less. The thickness of the transparent insulating layer 5 is, for example, a distance from the surface of the transparent conductive layer 3 to the surface of the transparent insulating layer 5 at a position of the transparent insulating layer 5 with the largest thickness.

A method for producing the cell assembly 100 configured as above includes: a step of preparing the photoelectric conversion part 2 having the main surface 20; a step of forming the transparent conductive layer 3 on the area 200 of the main surface 20 of the photoelectric conversion part 2 corresponding to each of the plurality of small segments, a step of forming, on the transparent conductive layer 3, the transparent insulating layer 5 having the opening 50 through which a part of the transparent conductive layer 3 is exposed; and a step of forming the collector electrode 4 on the transparent conductive layer 3 exposed through the opening by a plating method. In this production method, the step of forming the transparent conductive layer 3, the step of forming the transparent insulating layer 5, and the step of forming the collector electrode 4 are carried out so as to have the photoelectric conversion part 2 exposed in the defining area 111. A specific description will be hereinafter given on each of these steps with reference to FIG. 3 to FIG. 8.

For example, as shown in FIG. 3A and FIG. 3B, the step of preparing the photoelectric conversion part 2 includes a step of forming the silicon-based thin films 22, 23 on the silicon substrate 21. Specifically, the step of preparing the photoelectric conversion part 2 includes a step of forming the silicon-based thin films 24, 25 in addition to the step of forming the silicon-based thin films 22, 23.

The silicon substrate 21 is, for example, a 6-inch n-type single crystal silicon substrate. The silicon-based thin films 22, 23, 24, 25 are provided over the entire area of the first main surface 211 and the entire area of the second main surface 212 of the silicon substrate 21. Further, the silicon-based thin films 22, 23, 24, 25 are formed by, for example, a plasma CVD method.

Figure 4A:
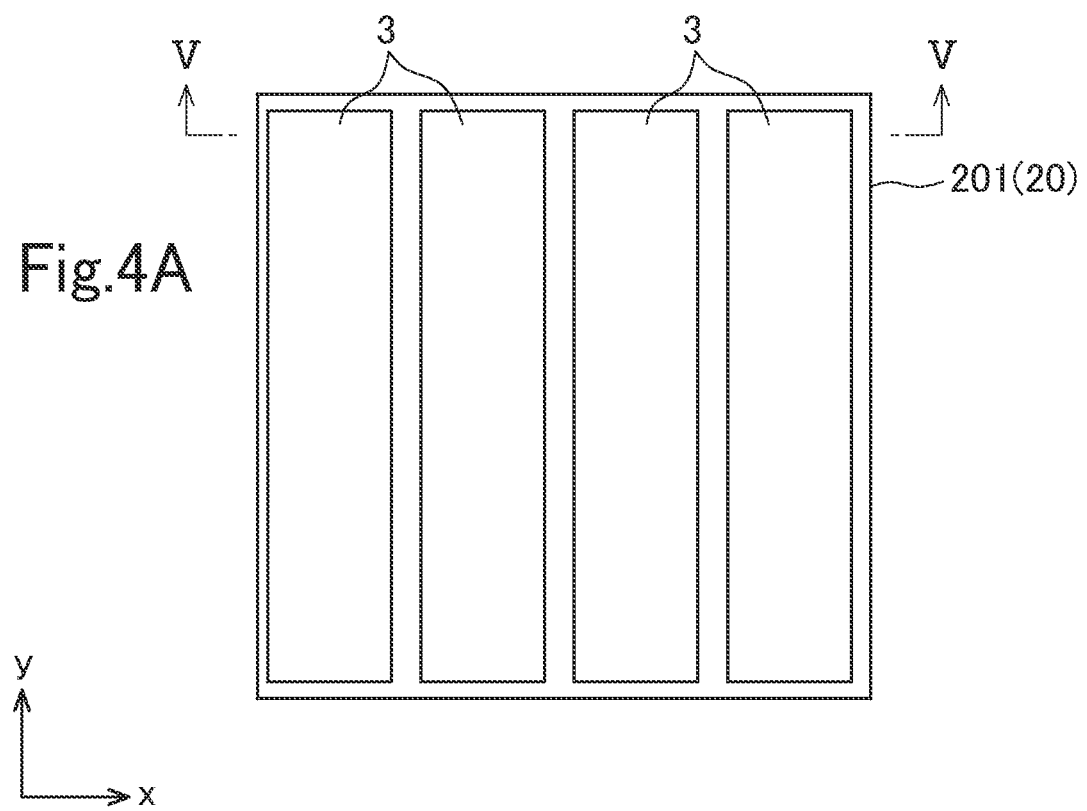
FIG. 4A is a plan view of the photoelectric conversion part with a transparent conductive layer formed thereon.
Figure 4B:
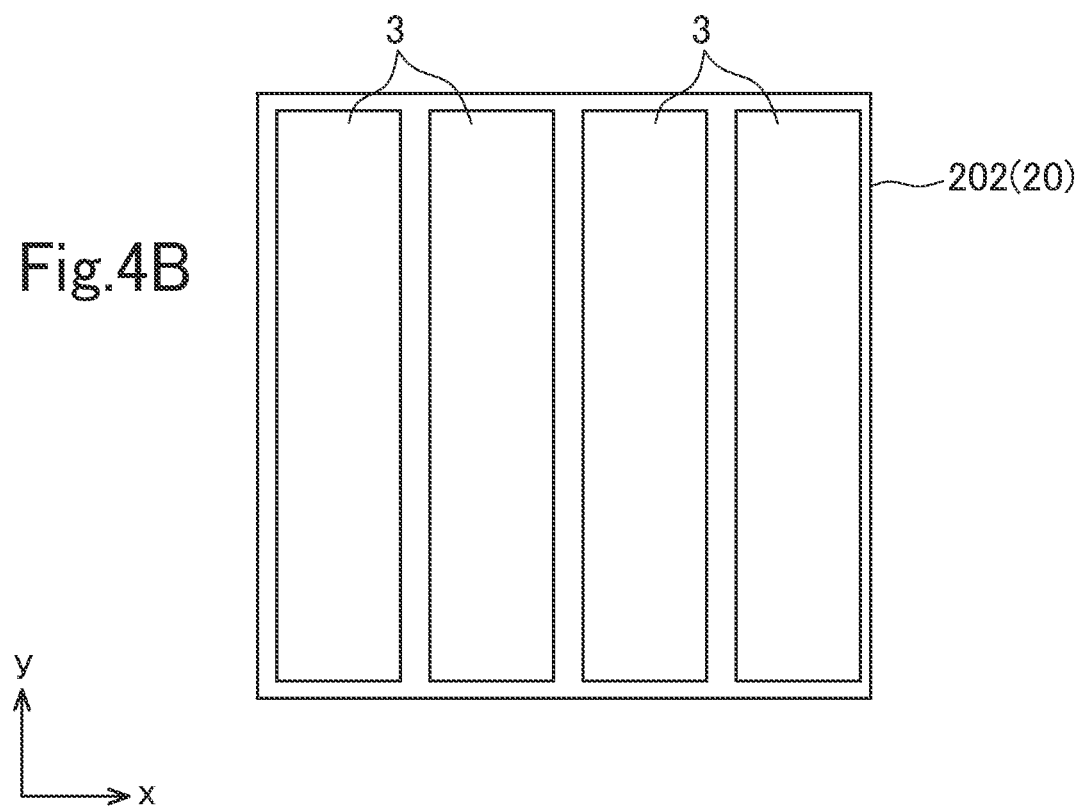
FIG. 4B is a bottom view of the photoelectric conversion part with a transparent conductive layer formed thereon.
Figure 5:
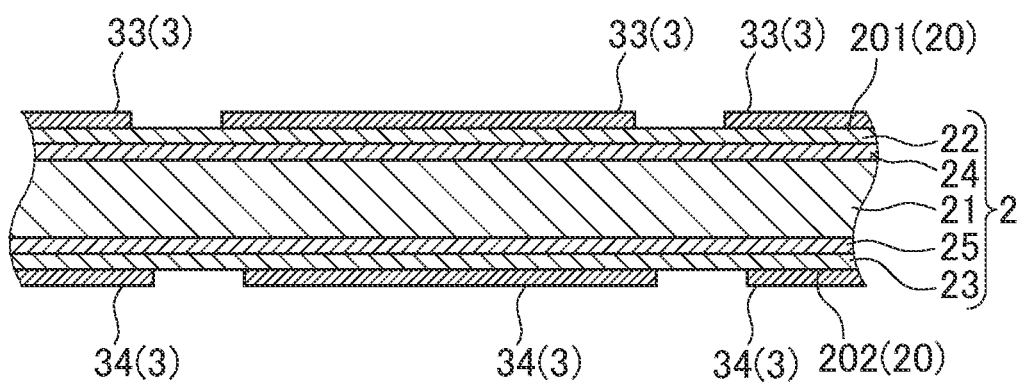
FIG. 5 is an enlarged cross-sectional view taken along line V-V in FIG. 4A.

As shown in FIG. 4A, FIG. 4B, and FIG. 5, the step of forming the transparent conductive layer 3 includes: a step of forming the first transparent conductive layer 33 on the first main surface 201 of the photoelectric conversion part 2; and a step of forming the second transparent conductive layer 34 on the second main surface 202 of the photoelectric conversion part 2. Specifically, the step of forming the transparent conductive layer 3 includes: a step of forming the first transparent conductive layer 33 on an opposite side to a side of the silicon substrate 21 of the first conductive silicon-based thin film 22 (i.e., to a side on which the first conductive silicon-based thin film 22 is in contact with the silicon substrate 21); and a step of forming the second transparent conductive layer 34 on an opposite side to a side of the silicon substrate 21 of the second conductive type silicon-based thin film 23 (i.e., to a side on which the second conductive silicon-based thin film 23 is in contact with the silicon substrate 21).

In the step of forming the transparent conductive layer 3, the transparent conductive layer 3 is formed into a rectangular shape elongated in the y-axis direction. Further, the transparent conductive layer 3 is formed to be disposed at an interval from an adjacent transparent conductive layer 3 in the x-axis direction. This configuration allows the transparent conductive layer 3 to be formed so that a portion of the photoelectric conversion part 2 serving as the defining area 111 of the cell assembly 100 is exposed. The transparent conductive layer 3 is for example, formed by a MOCVD method or a sputtering method.

Figure 6A:
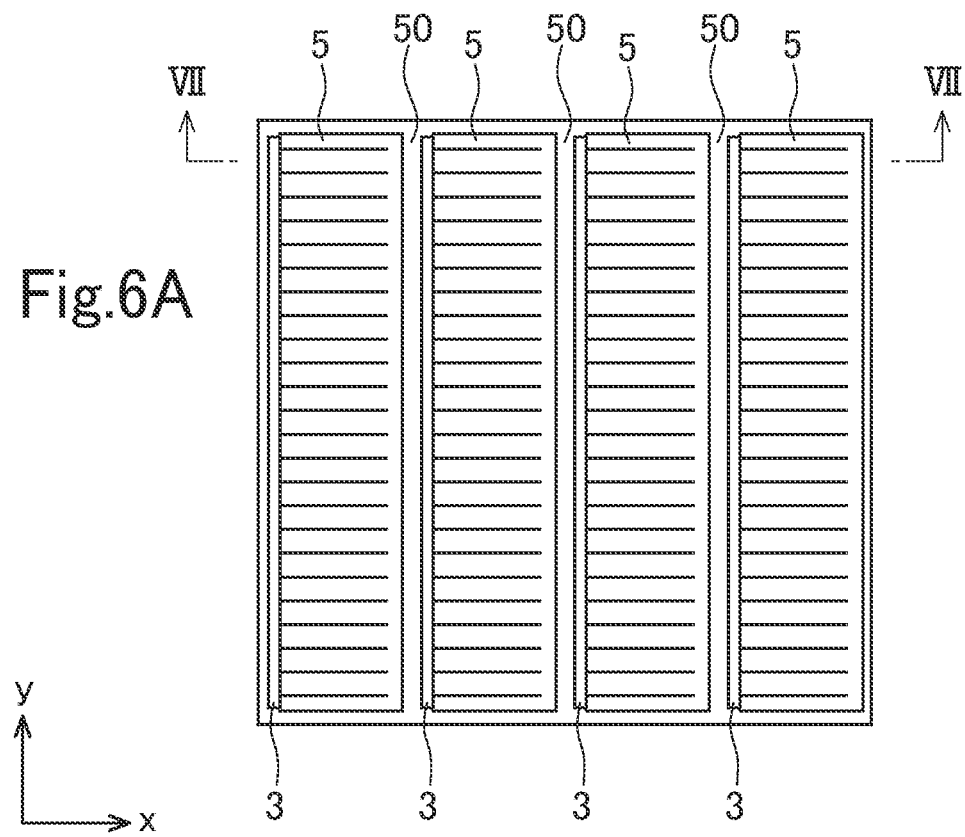
FIG. 6A is a plan view of the photoelectric conversion part with a transparent insulating layer formed thereon.
Figure 6B:
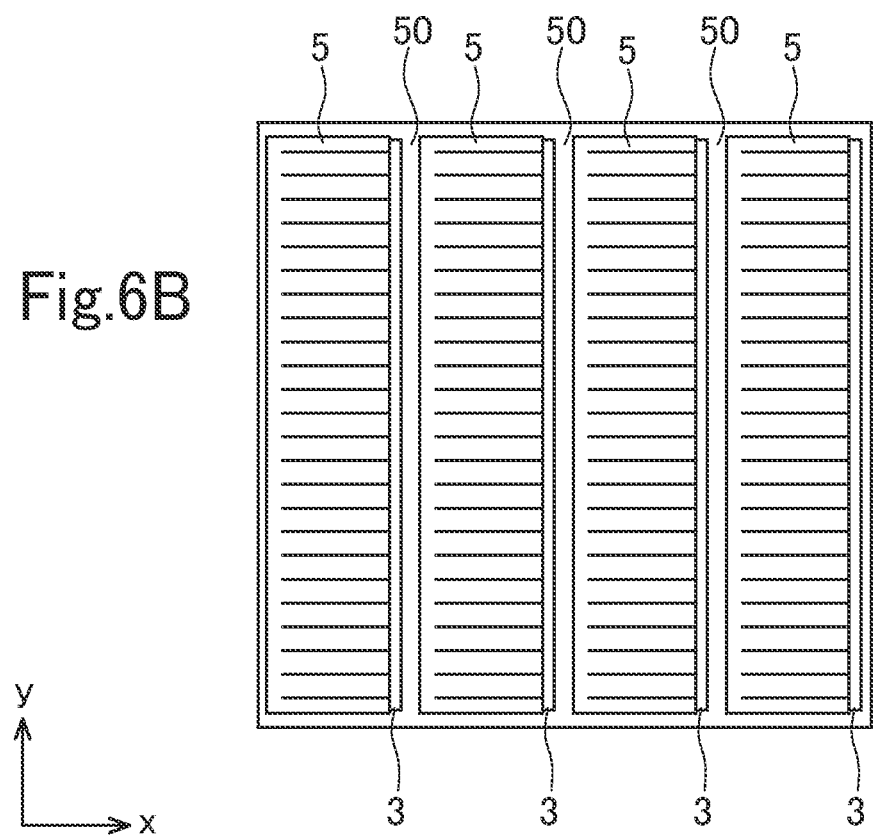
FIG. 6B is a bottom view of the photoelectric conversion part with a transparent insulating layer formed thereon.
Figure 7:
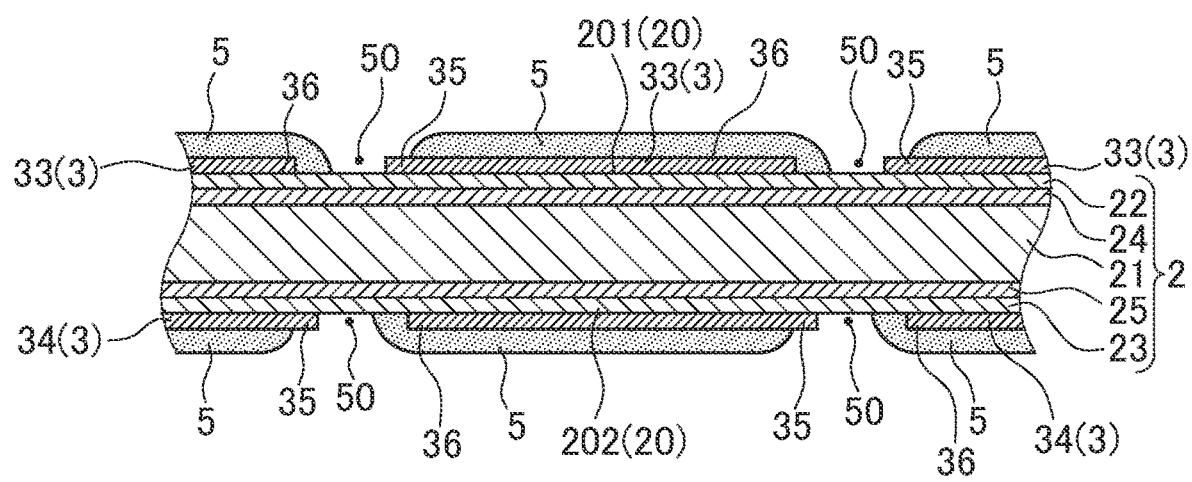
FIG. 7 is an enlarged cross-sectional view taken along line VII-VII in FIG. 6A.

As shown in FIG. 6A, FIG. 6B, and FIG. 7, the step of forming the transparent insulating layer 5 includes: a step of printing a resin solution on the transparent conductive layer 3; and a step of forming the transparent insulating layer 5 with the opening 50 formed in the printed resin layer. This resin solution is, for example, an acrylic resin solution. This acrylic resin solution is adjusted so that the solution viscosity at room temperature (25° C.) is 70 Pa s or more and 120 Pa s or less.

When the resin material forming the transparent insulating layer 5 is a material having thermosetting properties or photocuring properties, it is preferable that the transparent insulating layer 5 be cured before the step of forming the collector electrode 4 after the resin solution is printed on the transparent conductive layer 3 by screen printing or the like in the step of forming the transparent insulating layer 5.

In the step of forming the transparent insulating layer 5, the transparent insulating layer 5 is formed in a rectangular shape elongated in the y-axis direction. The transparent insulating layer 5 is formed to be disposed at an interval (opening 50) from an adjacent transparent insulating layer 5 in the x-axis direction. This configuration allows the transparent insulating layer 5 to be formed so that a portion of the photoelectric conversion part 2 serving as the defining area 1 of the cell assembly 100 is exposed.

The step of forming the collector electrode 4 includes a step of forming the plating layer 40 by a plating method on a portion of the transparent conductive layer 3 exposed through the opening 50 of the transparent insulating layer 5 (see FIG. 1A, FIG. 1B, and FIG. 2). Specifically, the step of forming the plating layer 40 includes: a step of depositing a first plating layer by electrolytic plating on the portion of the transparent conductive layer 3 exposed through the opening 50 of the transparent insulating layer 5; and a step of depositing a second plating layer by electrolytic plating on the first plating layer. The first plating layer is deposited using, for example, Ni, and the second plating layer is deposited using, for example. Cu.

In the step of forming the collector electrode 4, the collector electrode 4 is formed to have the plurality of finger electrodes 43 extending parallel to each other, and the bus bar electrode 44 extending to intersect (specifically, extending orthogonal to) the finger electrodes 43. Further, the collector electrode 4 is formed on the portion of the transparent conductive layer 3 exposed through the opening 50 of the transparent insulating layer 5. This configuration allows the collector electrode 4 to be formed so that the portion of the photoelectric conversion part 2 serving as the defining area 111 of the cell assembly 100 is exposed.

The cell assembly 100 produced by the above method can be cut off to produce the solar cells 1. The method of producing the solar cell 1 includes a step of cutting off the cell assembly 100 by irradiating the defining line 11 with a laser beam.

Figure 8A:
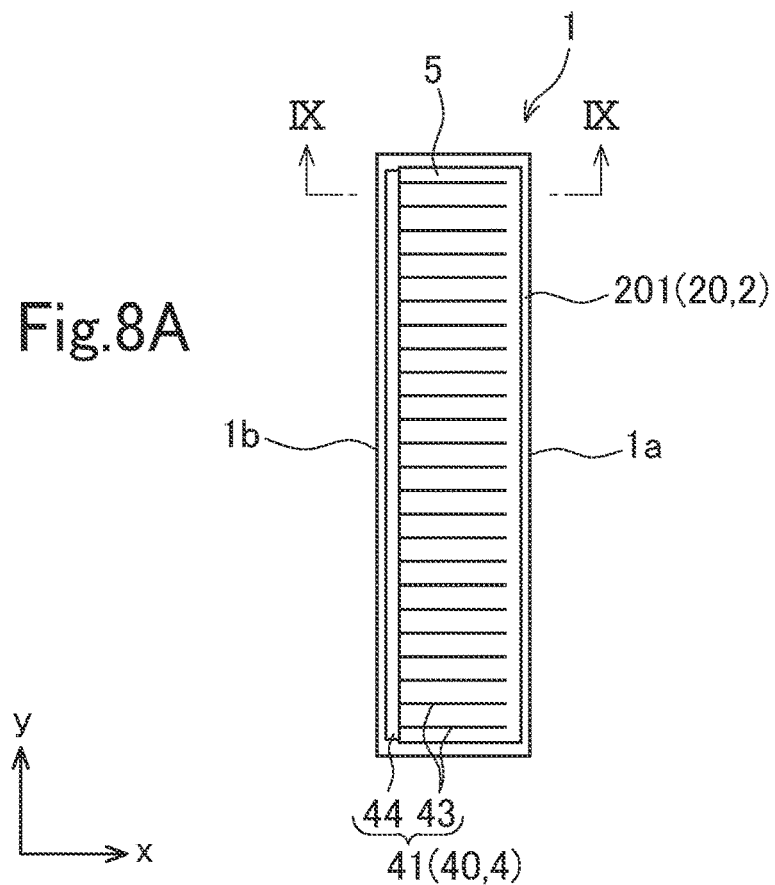
FIG. 8A is a plan view of a solar cell according to this embodiment.
Figure 8B:
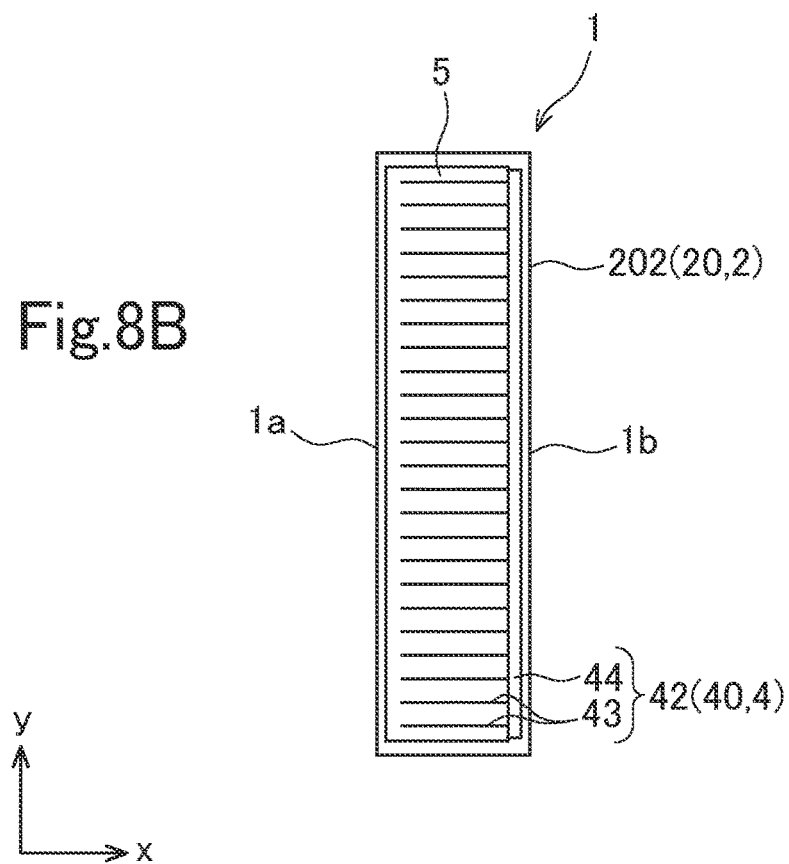
FIG. 8B is a bottom view of the solar cell.
Figure 9:
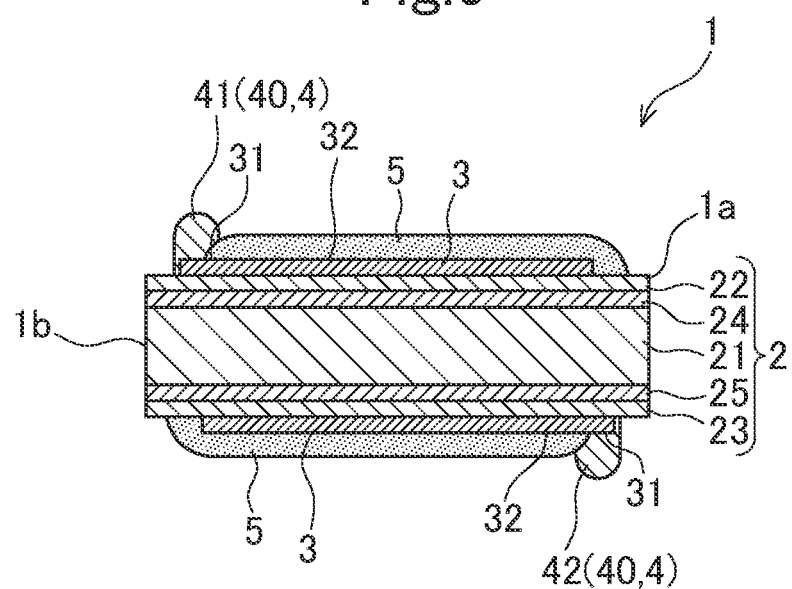
FIG. 9 is a cross-sectional view taken along line IX-IX in FIG. 8A.

As shown in FIG. 8A. FIG. 8B, and FIG. 9, the solar cell 1 has one linear side 1a and a linear opposite side 1b substantially parallel to the one side 1a. The solar cell 1 includes: the photoelectric conversion part 2 having the main surface 20; the transparent conductive layer 3 disposed on the main surface 20 of the photoelectric conversion part 2; the collector electrode 4 disposed on the first area 31 of the transparent conductive layer 3 and including the plating layer 40; and the transparent insulating layer 5 disposed on the second area 32 different from the first area 31 of the transparent conductive layer 3. The solar cell 1 has the photoelectric conversion part 2 exposed along the one side 1a and the opposite side 1b.

The solar cell 1 of this embodiment has a strip shape (i.e., a substantially rectangular shape) in plan view. Further, the solar cell 1 is, for example, a solar cell of double-sided light receiving type.

As shown in FIG. 10, a plurality of the solar cells 1 can form a solar cell string 101 by being interconnected with each other by shingling. The interconnection by shingling refers to the interconnection of each two adjacent solar cells 1 in the state where the first collector electrode 41 of one solar cell 1 of the each two adjacent two solar cells 1 overlaps the second collector electrode 42 of the other solar cell 1. In this interconnection by shingling, the collector electrodes 40 of the each two adjacent solar cells 1 are interconnected with each other by a conductive adhesive 6 (see FIG. 10). This conductive adhesive 6 is, for example, a metal paste, and specifically a silver paste.

According to the solar cell assembly 100 described above, the photoelectric conversion part 2 is exposed in the defining area 111 (see FIG. 2), that is, a portion of the main surface 20 of the photoelectric conversion part 2 having the defining line 11 (i.e., the defining area 111) is not covered with the transparent insulating layer 5 or the plating layer 40; thus, the cell assembly 100 can be easily cut off when the defining line 11 is simply irradiated with a laser beam.

According to the method for producing the cell assembly 100 of this embodiment, a portion of the main surface 20 of the photoelectric conversion part 2 having the defining line 11 (i.e., the defining areas 111) is not covered with the transparent insulating layer 5 or the plating layer 40, thus, the cell assembly 100 capable of being easily cut off when the defining line 11 is simply irradiated with a laser beam can be produced.

The solar cell 1 of this embodiment is easily obtained when a portion of the main surface 20 of the photoelectric conversion part 2 of the solar cell assembly 100 that is not covered with the transparent insulating layer 5 or the plating layer 40 is irradiated with a laser beam to divide the cell assembly 100.

Further, according to the method for producing the solar cell 1 of this embodiment, the solar cell 1 is easily obtained when a portion of the photoelectric conversion part 2 of the solar cell assembly 100 that is not covered with the transparent insulating layer 5 or the plating layer 40 is irradiated with a laser beam to divide the cell assembly 100.

It is a matter of course that the cell assembly and the solar cell of the present invention are not limited to the aforementioned embodiment, but various modifications can be made without departing from the gist of the present invention. For example, a configuration of an embodiment can be added to a configuration of another embodiment, and part of a configuration of an embodiment can be replaced by a configuration of another embodiment. Further, part of a configuration of an embodiment can be deleted.

In the cell assembly 100 of the aforementioned embodiment, each of the defining lines 11 extends at the center in the width direction (e.g., in the x-axis direction) of each corresponding one of the defining areas 111, but the defining line 11 can extend at any position as long as it is included in the corresponding defining area 111. Even when the defining line 11 extends at a position displaced from the center in the width direction of the defining area 111, the solar cell 1 is still obtained by cutting off the cell assembly 100 along the defining line 11. The plurality of defining areas 111 provided in the cell assembly 100 can have different widths from each other.

The materials and shapes of the layers forming the cell assembly 100 and the solar cell 1 are not limited to those of the aforementioned embodiment. For example, the plating layer 40 of the collector electrode 4 has a two-layered structure, but can have a third plating layer formed by electrolytic plating or electroless plating (including displacement plating) on the second plating layer made of Cu. The collector electrode 4 can include an electrode layer formed by a method other than a plating method, in addition to the plating layer 40.

The solar cell 1 can be of single-sided light receiving type.

In the solar cell 1 of this embodiment, the cell assembly 100 is cut off by having the defining line 11 irradiated with a laser beam, but a method for dividing the cell assembly 100 is not limited to laser cutting. For example, the solar cell 1 can be obtained by forming a groove along the defining line 11 of the cell assembly 100 by a laser or mechanical scribing and dividing the cell assembly 100 along the groove. Even in this case, the grooves are easily formed and the cell assembly 100 is easily divided into the solar cells 1 since no transparent insulating layer 5 or no plating layer 40 is on the defining line 11.

According to the present invention, it is possible to provide: a cell assembly, which is a material of solar cells to be interconnected with each other by shingling to form a solar cell module, the cell assembly including a metal electrode formed by a plating method and capable of being easily cut off; a method for producing the cell assembly; a solar cell formed from the cell assembly; and a method for producing the solar cell.

A solar cell assembly of the present invention includes a plurality of small segments respectively serving as a plurality of solar cells when divided, the solar cell assembly having one linear side in plan view, each of the plurality of small segments being defined by a defining line, which is a straight line substantially parallel to the linear one side of the cell assembly, the solar cell assembly including: a photoelectric conversion part having a main surface; a transparent conductive layer disposed on an area of the main surface of the photoelectric conversion part corresponding to each of the plurality of small segments, the transparent conductive layer having a first area and a second area located at a different position from the first area; a collector electrode disposed on the first area of the transparent conductive layer and including a plating layer; and a transparent insulating layer disposed on the second area of the transparent conductive layer, in which the photoelectric conversion part is exposed in a defining area, which is an area formed along the defining line and including the defining line.

According to such a configuration, a portion of the main surface of the photoelectric conversion part having the defining line (i.e., the defining area) is not covered with the transparent insulating layer or the plating layer; thus, the cell assembly can be easily cut off when the defining line is simply irradiated with a laser beam.

A method for producing a solar cell assembly of the present invention is a method for producing a solar cell assembly including a plurality of small segments respectively serving as a plurality of solar cells when divided, the solar cell assembly having one linear side in plan view, each of the plurality of small segments being defined by a defining line, which is a straight line substantially parallel to the linear one side of the cell assembly, the method including: a step of preparing a photoelectric conversion part having a main surface; a step of forming a transparent conductive layer on an area of the main surface of the photoelectric conversion part corresponding to each of the plurality of small segments; a step of forming, on the transparent conductive layer, a transparent insulating layer having an opening through which a part of the transparent conductive layer is exposed; and a step of forming a collector electrode by a plating method on the transparent conductive layer exposed through the opening, in which the step of forming the transparent conductive layer, the step of forming the transparent insulating layer, and the step of forming the collector electrode are carried out to have the photoelectric conversion part exposed in a defining area formed along the defining line and including the defining line.

According to such a configuration, a portion of the main surface of the photoelectric conversion part having the defining line (i.e., the defining area) is not covered with the transparent insulating layer or the plating layer; thus, the cell assembly of the solar cells capable of being easily cut off by simply having the defining line irradiated with a laser beam can be produced.

A solar cell of the present invention is capable of forming a solar cell string when a plurality of the solar cells are interconnected with each other by shingling, the solar cell having one linear side and a linear opposite side substantially parallel to the one side in plan view, the solar cell including: a photoelectric conversion part having a main surface; a transparent conductive layer disposed on the main surface of the photoelectric conversion part, the transparent conductive layer having a first area and a second area located at a different position from the first area; a collector electrode disposed on the first area of the transparent conductive layer and including a plating layer; and a transparent insulating layer disposed on the second area of the transparent conductive layer, in which the photoelectric conversion part is exposed on the one side and the opposite side.

The method for producing the solar cell having such a configuration is easily obtained when a portion of the main surface of the photoelectric conversion part of the solar cell assembly that is not covered with the transparent insulating layer or the plating layer is irradiated with a laser beam to divide this cell assembly.

A method for producing a solar cell of the present invention is a method for producing a solar cell using the solar cell assembly, and includes: a step of cutting the cell assembly by irradiating the defining line with a laser beam.

According to such a configuration, the solar cell is easily obtained when a portion of the photoelectric conversion part of the solar cell assembly that is not covered with the transparent insulating layer or the plating layer is irradiated with a laser beam to divide the cell assembly.

REFERENCE SIGNS LIST

1: Solar cell
1a: One side
1b: Opposite side
2: Photoelectric conversion part
3: Transparent conductive layer
4: Collector electrode
5: Transparent insulating layer
6: Conductive adhesive 10: Small segment
11: Defining line
20: Main surface
21: Conductive type crystal silicon substrate (silicon substrate)
22: First conductive type silicon-based thin film (conductive type silicon-based thin film, silicon-based thin film)
23: Second conductive type silicon-based thin film (conductive type silicon-based thin film, silicon-based thin film)
24, 25: Intrinsic silicon-based thin film (silicon-based thin film)
31: First area
32: Second area
33: First transparent conductive layer
34: Second transparent conductive layer
35, 36: End portion
40: Plating layer
41: First collector electrode
42: Second collector electrode
43: Finger electrode
44: Bus bar electrode
50: Opening
100: Cell assembly
100a: Side
101: Solar cell string
111: Defining area
111a, 111b: End edge
200: Area
201: First main surface
202: Second main surface
211: First main surface
212: Second main surface

The invention claimed is:

1. A solar cell assembly comprising a plurality of small segments respectively serving as a plurality of solar cells when divided, the solar cell assembly having one linear side in plan view,
each of the plurality of small segments being defined by a defining line, which is a straight line substantially parallel to the one linear side of the cell assembly,
the solar cell assembly comprising:
a photoelectric conversion part having a main surface;
a transparent conductive layer disposed on an area of the main surface of the photoelectric conversion part corresponding to each of the plurality of small segments, the transparent conductive layer comprising a first end portion, a first area, a second area located at a different position from the first area, and a second end portion extending in a direction from the first end portion;
a collector electrode comprising a plating layer, the collector electrode including a portion disposed on the first area of the transparent conductive layer, and a plurality of finger electrodes disposed on the transparent conductive layer and extending in the direction in which the second end portion of the transparent conductive layer extends; and
a transparent insulating layer disposed on the second area of the transparent conductive layer, the transparent insulating layer comprising an opening exposing the first end portion of the transparent conductive layer, and the transparent insulating layer covering the second end portion of the transparent conductive layer extending in the direction in which the plurality of finger electrodes extend, wherein
the photoelectric conversion part is exposed in a defining area, which is an area formed along the defining line and including the defining line.

2. A method for producing a solar cell assembly comprising a plurality of small segments respectively serving as a plurality of solar cells when divided, the solar cell assembly having one linear side in plan view, each of the plurality of small segments being defined by a defining line, which is a straight line substantially parallel to the one linear side of the cell assembly, the method comprising:
preparing a photoelectric conversion part having a main surface;
forming a transparent conductive layer on an area of the main surface of the photoelectric conversion part corresponding to each of the plurality of small segments, the transparent conductive layer comprising a first end portion and a second end portion extending in a direction from the first end portion;
forming a transparent insulating layer on the transparent conductive layer, the transparent insulating layer comprising an opening through which the first end portion of the transparent conductive layer is exposed, and the transparent insulating layer covering the second end portion of the transparent conductive layer; and
forming a collector electrode by a plating method on the transparent conductive layer exposed through the opening, the collector electrode comprising a plurality of finger electrodes extending in the direction in which the second end portion of the transparent conductor layer extends, wherein
forming the transparent conductive layer, forming the transparent insulating layer, and forming the collector electrode are carried out to have the photoelectric conversion part exposed in a defining area formed along the defining line and including the defining line.

3. A method for producing a solar cell using the solar cell assembly according to claim 1, the method comprising:
cutting the cell assembly by irradiating the defining line with a laser beam.

4. A solar cell capable of forming a solar cell string when a plurality of the solar cells are interconnected with each other by shingling, the solar cell having one linear side and a linear opposite side substantially parallel to the one linear side in plan view, the solar cell comprising:
a photoelectric conversion part having a main surface;
a transparent conductive layer disposed on the main surface of the photoelectric conversion part, the transparent conductive layer comprising a first end portion extending along the one side, a first area, a second area located at a different position from the first area, and a second end portion extending along the opposite side in a direction from the first end portion;
a collector electrode comprising a plating layer, the collector electrode including a portion disposed on the first area of the transparent conductive layer, and a plurality of finger electrodes disposed on the transparent conductive layer and extending in the direction in which the second end portion of the transparent conductive layer extends; and
a transparent insulating layer disposed on the second area of the transparent conductive layer, the transparent insulating layer comprising an opening exposing the first end portion of the transparent conductive layer, and the transparent insulating layer covering an entire area, including an end edge, of the second end portion of the transparent conductive layer extending in the direction in which the plurality of finger electrodes extend, wherein
the photoelectric conversion part is exposed on the one side and the opposite side.

\* \* \* \* \*